US011276740B2

(12) United States Patent
Kajiyama

(10) Patent No.: US 11,276,740 B2
(45) Date of Patent: Mar. 15, 2022

(54) SEMICONDUCTOR DEVICE AND DISPLAY DEVICE

(71) Applicant: Japan Display Inc., Tokyo (JP)

(72) Inventor: Kenta Kajiyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/833,763

(22) Filed: Mar. 30, 2020

(65) Prior Publication Data

US 2020/0227497 A1 Jul. 16, 2020

Related U.S. Application Data

(63) Continuation of application No. PCT/JP2018/029621, filed on Aug. 7, 2018.

(30) Foreign Application Priority Data

Oct. 13, 2017 (JP) .............................. JP2017-199090

(51) Int. Cl.
*H01L 27/32* (2006.01)
*H01L 51/52* (2006.01)

(52) U.S. Cl.
CPC ...... *H01L 27/3262* (2013.01); *H01L 51/5271* (2013.01); *H01L 2251/306* (2013.01); *H01L 2251/308* (2013.01)

(58) Field of Classification Search
CPC ............. H01L 27/3262; H01L 51/5271; H01L 2251/306; H01L 2251/308
USPC ........................................................ 257/40
See application file for complete search history.

(56) References Cited

U.S. PATENT DOCUMENTS

| 2011/0233527 | A1  | 9/2011  | Hong et al. |
| 2014/0117842 | A1* | 5/2014  | Hanamura .......... H01L 27/3248 313/504 |
| 2014/0209914 | A1  | 7/2014  | Nagasawa et al. |
| 2014/0368106 | A1* | 12/2014 | Nozawa ............. H01L 51/5253 313/317 |
| 2017/0365812 | A1* | 12/2017 | Choung ............. H01L 27/3276 |
| 2018/0031903 | A1* | 2/2018  | Nagata ................ H01L 23/3171 |
| 2019/0006443 | A1* | 1/2019  | Hanashima ......... H01L 27/3246 |

OTHER PUBLICATIONS

Partial English Machine Translation of International Search Report (PCT/ISA/210) dated Nov. 6, 2018 for the corresponding PCT application No. PCT/JP2018/029621.
Japanese Office Action dated Apr. 20, 2021 for the corresponding Japanese Patent Application No. 2017-199090, with English machine translation.

* cited by examiner

*Primary Examiner* — Dzung Tran
(74) *Attorney, Agent, or Firm* — Michael Best & Friedrich LLP

(57) ABSTRACT

The semiconductor device includes: a first conductor pattern disposed on an insulating surface; and a second conductor pattern disposed on the insulating surface and spaced apart from the first conductor pattern, wherein, in a planar view, a first side of the first conductor pattern and a second side of the second conductor pattern are each formed of a plurality of sides, the first side and the second side face each other, and each of a maximum length of a plurality of sides constituting the first side and a maximum length of a plurality of sides constituting the second side is shorter than the minimum distance between the first side and the second side.

16 Claims, 14 Drawing Sheets

SEMICONDUCTOR DEVICE AND DISPLAY DEVICE

CROSS REFERENCE TO RELATED APPLICATIONS

This application is based on and claims the benefit of priority from the prior Japanese Patent Application No. 2017-199090, filed on Oct. 13, 2017, and PCT Application No. PCT/JP2018/029621 filed on Aug. 7, 2018, the entire contents of which are incorporated herein by reference.

FIELD

The present invention is related to a display device. In particular, the present invention is related to an organic EL display device including an organic EL (electroluminescence) element as a display element.

BACKGROUND

In recent years, an organic EL display device is attracting attention as a display for use in a display screen of a mobile terminal or the like. An organic EL display device has an advantage in which the contrast characteristics and viewing angle characteristics are better than those of a liquid crystal display device. As a result, the development of an organic EL display device is accelerating as a display which can replace a liquid crystal display device.

The organic EL element arranged in the organic EL display device has a structure in which an organic EL material is provided is arranged as a light emitting material between an anode and a cathode. An organic EL element emits light by applying a voltage to an organic EL material using an anode and a cathode. Currently, organic EL elements which have a structure for extracting light from the cathode side are mainly used. In this case, in order to increase luminous efficiency, a highly reflective metal material is used for the anode. In recent years, an organic EL display device using a pixel electrode having a stacked structure of a metal film having a reflective function and a transparent conductive film has been developed (for example, Japanese Laid Open Patent Publication 2014-145857).

SUMMARY

In an embodiment of the present invention, a semiconductor device includes: a first conductor pattern disposed on an insulating surface; and a second conductor pattern disposed on the insulating surface and spaced apart from the first conductor pattern, wherein, in a planar view, a first side of the first conductor pattern and a second side of the second conductor pattern are each formed of a plurality of sides, the first side and the second side face each other, and each of a maximum length of a plurality of sides constituting the first side and a maximum length of a plurality of sides constituting the second side is shorter than the minimum distance between the first side and the second side.

In an embodiment of the present invention, a display device includes: a first pixel electrode disposed on an insulating surface; and a second pixel electrode adjacent to the first electrode and spaced apart from the first pixel electrode, wherein, in a planar view, a first side of the first pixel electrode and a second side of the second pixel electrode are each formed of a plurality of sides, the first side and the second side face each other, and each of a maximum length of a plurality of sides constituting the first side and a maximum length of a plurality of sides constituting the second side is shorter than the minimum distance between the first side and the second side.

DESCRIPTION OF EMBODIMENTS

When a pixel electrode is used as an anode electrode of an organic electroluminescence device, it is desirable that the material serving as the outermost surface of the anode electrode is a material having a high work function. Therefore, when the pixel electrode having a stacked structure of the metal film and the transparent conductive film having the above-mentioned reflective function are used, the transparent conductive film having a large work function is stacked on the metal film. At this time, particles may be generated due to differences in etch rates between the metal film and the transparent conductive film. This point will be explained with reference to FIGS. 11 to 14.

Figure 11:
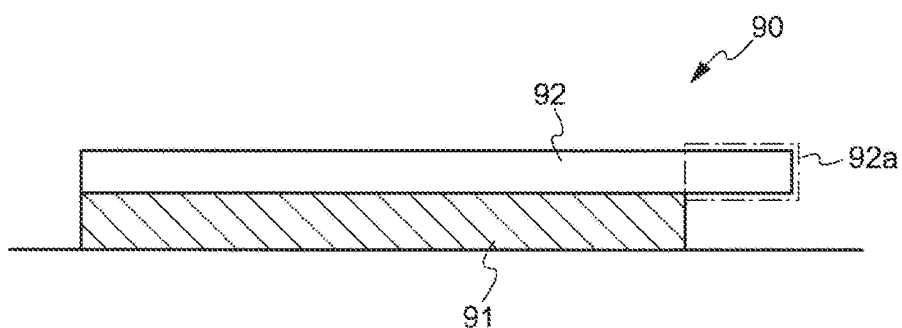
FIG. 11 is a cross-sectional view showing a structure of a conductive pattern having a stacked structure of a metal film and a transparent conductive film.

FIG. 11 is a cross-sectional view showing the construction of the conductor pattern having a stacked structure of the metal film and the transparent conductive film. When the etching rate of a metal film 91 is larger than the etching rate of a transparent conductive film 92, as shown in FIG. 11, the end part of the transparent conductive film 92 may protrude outward as compared with the end part of the metal film 91 as the etching process proceeds. In other words, at the end of the transparent conductive film 92 of a conductor pattern 90, a protrusion part 92a protruding from the end of the metal film 91 may be formed.

Figure 12:
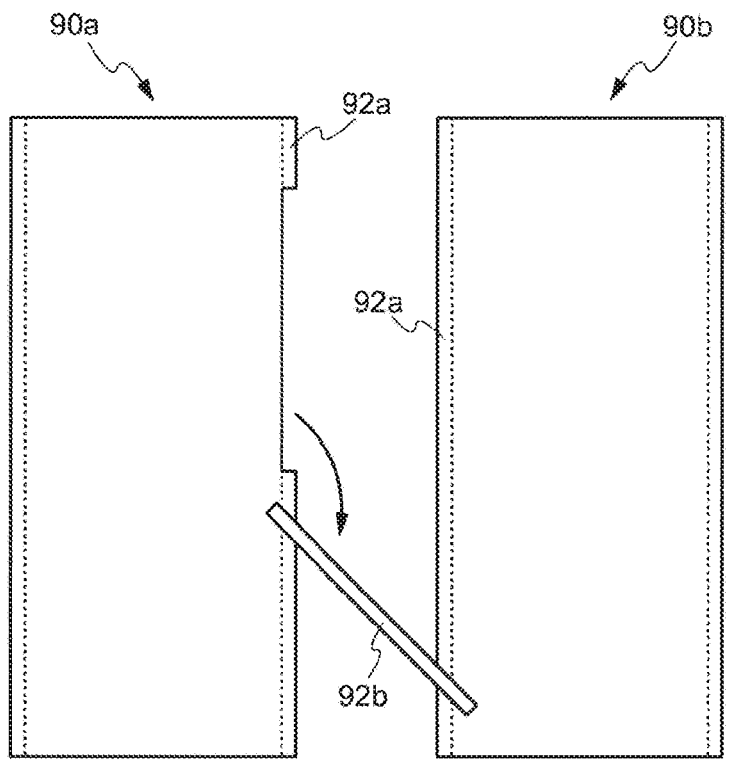
FIG. 12 is a planar diagram showing a state in which particles are generated between adjacent conductive patterns.

FIG. 12 is a planar view showing a condition in which particles are generated between the neighboring conductor pattern. Each of a conductor pattern 90a and a conductor pattern 90b has the protrusion part 92a shown in FIG. 11. When the conductor pattern 90a and the conductor pattern 90b proceed to the subsequent processes, the protrusion part 92a falls off due to some shock or the like, and a particle 92b is generated. For example, as shown in FIG. 12, when the protrusion part 92a falls off, the elongated particle 92b may be generated.

In this case, as shown in FIG. 12, it may happen that one end of the particle 92b contacts the conductor pattern 90a and the other end contacts the conductor pattern 90b. That is, the particle 92b formed of the transparent conductive film may short-circuit the conductor pattern 90a and the conductor pattern 90b. The occurrence of such a short-circuit may result in a malfunction of display device, which may cause a decrease in reliability.

Figure 13:
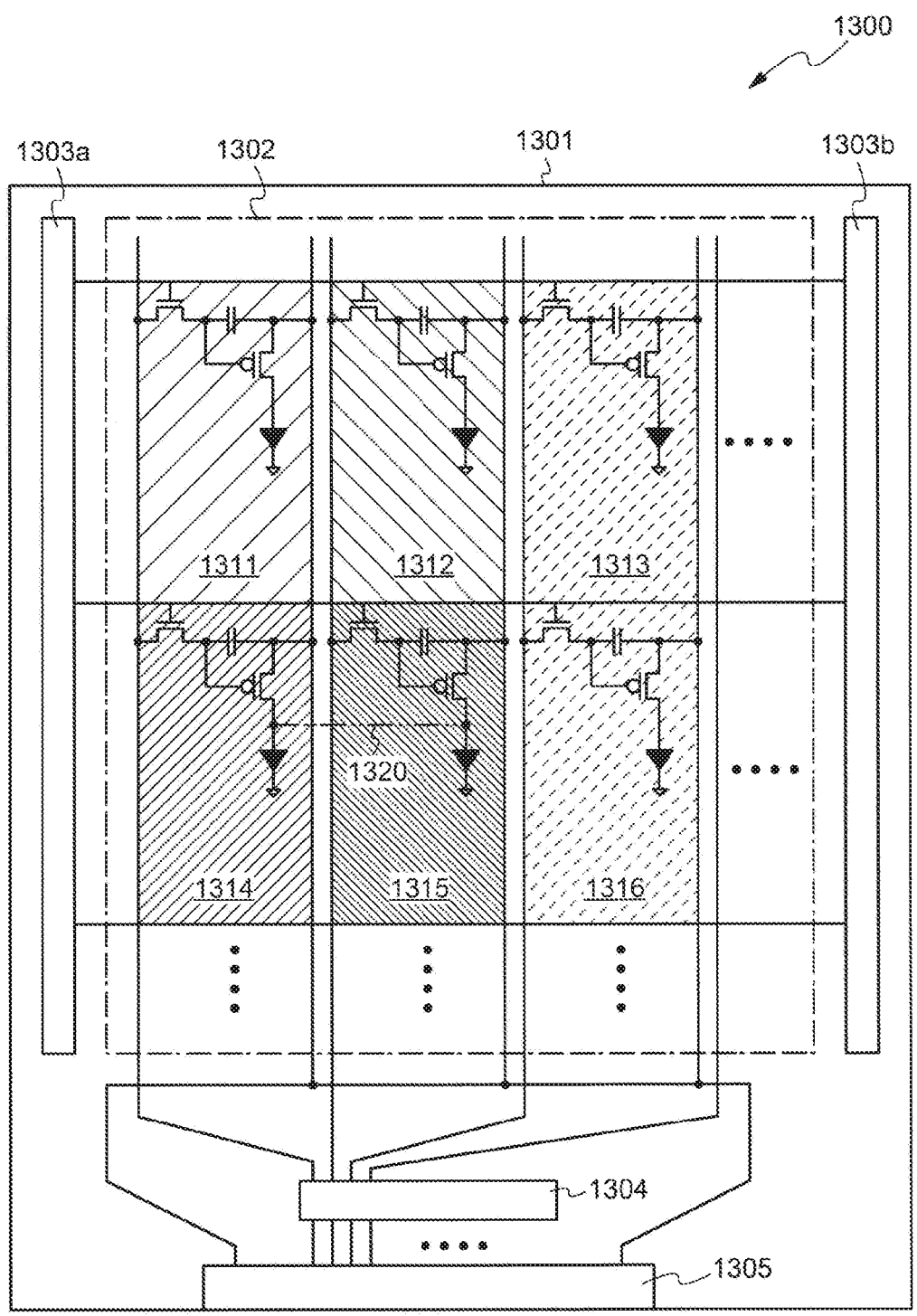
FIG. 13 is a circuit diagram showing an example of an operation failure when a short circuit occurs between adjacent conductive patterns.
Figure 14:
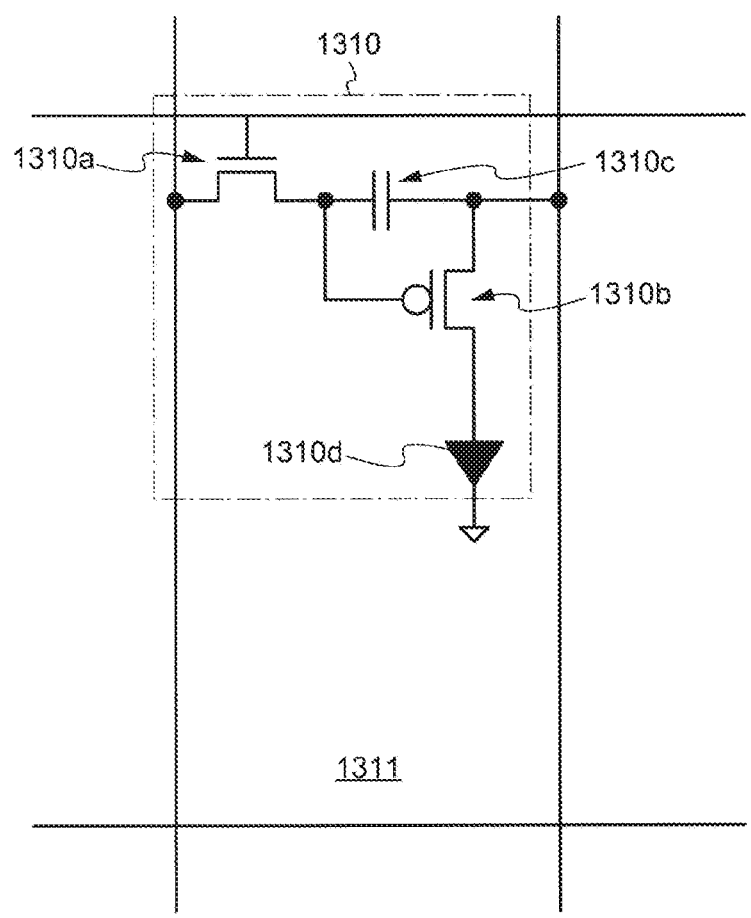
FIG. 14 is a circuit diagram showing an example of a structure of a pixel circuit.

FIG. 13 is a circuit diagram showing an exemplary malfunction when the neighboring conductor pattern is short-circuited. FIG. 14 is a circuit diagram showing an exemplary configuration of a pixel circuit. In FIG. 13, an organic EL display device 1300 has a pixel region 1302, a scanning line drive circuit 1303a and 1303b, a video signal line drive circuit 1304, and a terminal part 1305 on a substrate 1301. The pixel region 1302 is provided with a plurality of sub-pixels 1311 to 1316. It should be noted that although more sub-pixels are actually arranged, six pixels of the sub-pixel 1311 to 1316 are exemplified here.

As shown in FIG. 14, each of the sub-pixels 1311 to 1316 includes a pixel circuit 1310. The pixel circuit 1310 includes a switching element 1310a, a driving element 1310b, a storage capacitor 1310c, and a light-emitting element 1310d. The switching element 1310a is composed of a N channel type TFT (thin film transistor), and the driving element 1310b is composed of a P channel type TFT. Since the configuration of the pixel circuit 1310 is well known, detailed descriptions thereof will be omitted.

In FIG. 13, the sub-pixel 1311 and 1314 are pixel corresponding to red, respectively. The sub-pixel 1312 and 1315 are the pixel corresponding to green, respectively. The sub-pixel 1313 and 1316 are the pixel corresponding to blue, respectively. The sub-pixel 1311, 1312 and 1313 constitute one pixel. That is, by independently controlling the light emission states of the sub-pixel 1311 to 1313, various colors can be displayed as one pixel. The same applies to the sub-pixel 1314, 1315 and 1316.

The sub-pixel 1311 to 1313 are all normally operating pixel. Here, it is assumed that pixel composed of the sub-pixel 1311 to 1313 emits light with the light emission color A. It is also assumed that pixel composed of the sub-pixel 1314 to 1316 emits light with the emission color A in the same manner. In FIG. 13, the difference between the light emission states of the pixel 1311 to 1316 is indicated by hatching.

In FIG. 13, of the sub-pixel 1314 to 1316, the sub-pixel 1314 and the sub-pixel 1315 are short-circuited by the particle 92b shown in FIG. 12. This means that the drain of the driving element 1310b of the sub-pixel 1314 and the drain of the driving element 1310b of the sub-pixel 1315 are in conduction. In FIG. 13, this state is indicated by a two-dot broken line 1320. As a result, the sub-pixel 1314 corresponding to the red color and the sub-pixel 1315 corresponding to the green color emit light with brightness differing from the sub-pixel 1311 corresponding to the red color and the sub-pixel 1312 corresponding to the green color, respectively, which are normally operating.

When the drain of the driving element 1310b of the sub-pixel 1314 and the drain of the driving element 1310b of the sub-pixel 1315 are electrically connected, the current flowing in each of the light-emitting element 1310d changes from the original control values. That is, the sub-pixel 1314 and the sub-pixel 1315 cannot be independently controlled, and the currents flowing through the light-emitting element 1310d are mutually affected. As a result, the three colors of R, G, and B emanating from the sub-pixel 1314 to 1316 are combined in a different ratio than the controlled ratio, resulting in a different color than the intended color.

As described above, when the pixel electrodes of the adjacent sub-pixels are short-circuited by particles or the like, the adjacent sub-pixels cannot be independently controlled. As a result, the emission colors of the respective pixel composed of a plurality of sub-pixels cannot be accurately controlled, resulting in a malfunction of the organic EL display device.

The present invention has been made in a view of the above-mentioned problems, and an object thereof is to prevent short-circuiting between electrodes due to particles.

The embodiments of the present invention are explained below while referring to the diagrams. However, it is possible to perform the present invention using various different forms, and the present invention should not be limited to the content described in the embodiments exemplified herein.

In addition, although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

In the present specification and the scope of the patent claims, when expressing a mode in which another structure is arranged above a certain structure, in the case where it is simply described as [above], unless otherwise noted, a case where another structure is arranged directly above a certain structure as if in contact with that structure, and a case where another structure is arranged via another structure above a certain structure, are both included.

In addition, in the present specification and scope of the patent claims, [upper] and [lower] in a cross-sectional view of a display device refer to the relative positional relationship with respect to surfaces on the side of the substrate on which an electrooptic element is formed (referred to simply as "surface" herein). For example, in the present specification, for the convenience of explanation, the direction from the surface of a substrate toward an electrooptic element is referred to as [up], and the opposite direction is referred to as [below]. In addition, [upper] and [lower] in a planar view of a pixel region indicates [upper] and [lower] in the case when a diagram is viewed from the front.

[Display device] refers to a structure which displays an image using an electrooptical layer. For example, the term display device may sometimes refer to a display cell which includes an electrooptical layer, or to a structure in which another optical member (for example, a polarization member, a backlight, a touch panel or the like) is attached to a display cell. Here, as long as there is no technical contradiction which occurs, an [electrooptical layer] may include a liquid crystal layer, an electroluminescence (EL) layer, an electrochromic (EC) layer and an electrophoretic layer. Therefore, although an embodiment described herein is explained by exemplifying an organic EL display device including an organic EL layer as a display device, this does not exclude application to a display device including another of the electrooptical layers described above.

First Embodiment

<Display Device Structure>

In the present embodiment, an organic EL display device is explained as an example of a display device. The organic EL display device is a display device which uses an organic EL element as an electrooptical element.

Figure 1:
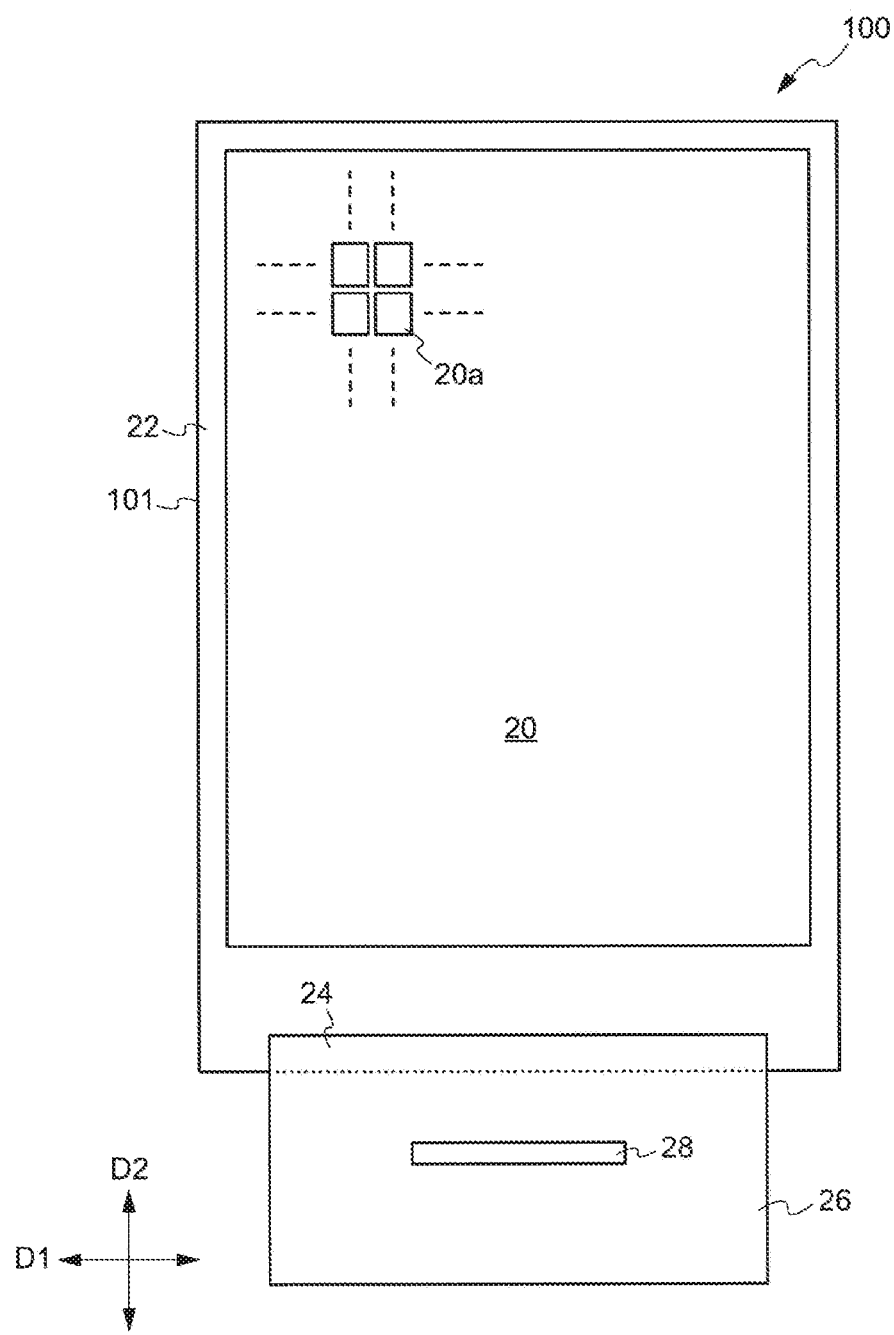
FIG. 1 is a planar diagram showing a structure of an organic EL display device according to first embodiment of the present invention.

FIG. 1 is a planar view showing a structure of an organic EL display device 100 of the first embodiment. In FIG. 1, an array substrate 101 is a substrate in which a plurality of pixels including organic EL elements are formed on the surface side of a support substrate (not shown in the diagram). The array substrate 101 may also be called an active matrix substrate.

The array substrate 101 includes a pixel region 20 and a periphery region 22. A plurality of pixels 20a including an organic EL element are arranged in the pixel region 20. Specifically, the pixels 20a are arranged in a matrix shape as a whole in the direction D1 (row direction) and the direction D2 (column direction) shown in FIG. 1. Although illustration is omitted, in the periphery region 22, a circuit (for example, a shift-register circuit) which transmits a signal to a pixel 20a is arranged. However, in the present embodiment, there is no particular limitation to what type of circuit is arranged in the periphery region 22. Furthermore, the pixel area 20 may be arranged not only with pixels which actually contribute to image display, but also dummy pixels may be arranged which do not contribute to image display. In this case, a region arranged with pixels which contribute to image display may be called a display region.

The array substrate 101 includes a terminal region 24 as a part of the periphery region 22. A plurality of wirings (not shown in the diagram) are collected in the terminal region 24, and a flexible printed circuit substrate 26 is electrically connected to the wirings. A signal (for example, an image video signal) which is transmitted from an external device (not shown in the diagram) via the flexible printed circuit substrate 26 is transmitted to a pixel 20a via a plurality of wirings which extend from the terminal region 24.

In the present embodiment, a drive circuit 28 formed from an IC chip or the like is mounted on the flexible printed circuit substrate 26. The drive circuit 28 has a role for transmitting a control signal such as a start pulse to a shift register circuit (not shown in the diagram) or the like arranged in the periphery region 22, and for performing predetermined signal processing of an image signal. However, the drive circuit 28 is not an essential part of the structure and can be omitted.

Next, the structure of the pixel 20a of the organic EL display device 100 in the present embodiment is explained. The pixel 20a shown in FIG. 1 is actually formed form three sub-pixels corresponding to three colors of RGB. However, for the convenience of explanation, one sub-pixel is explained here.

Figure 2:
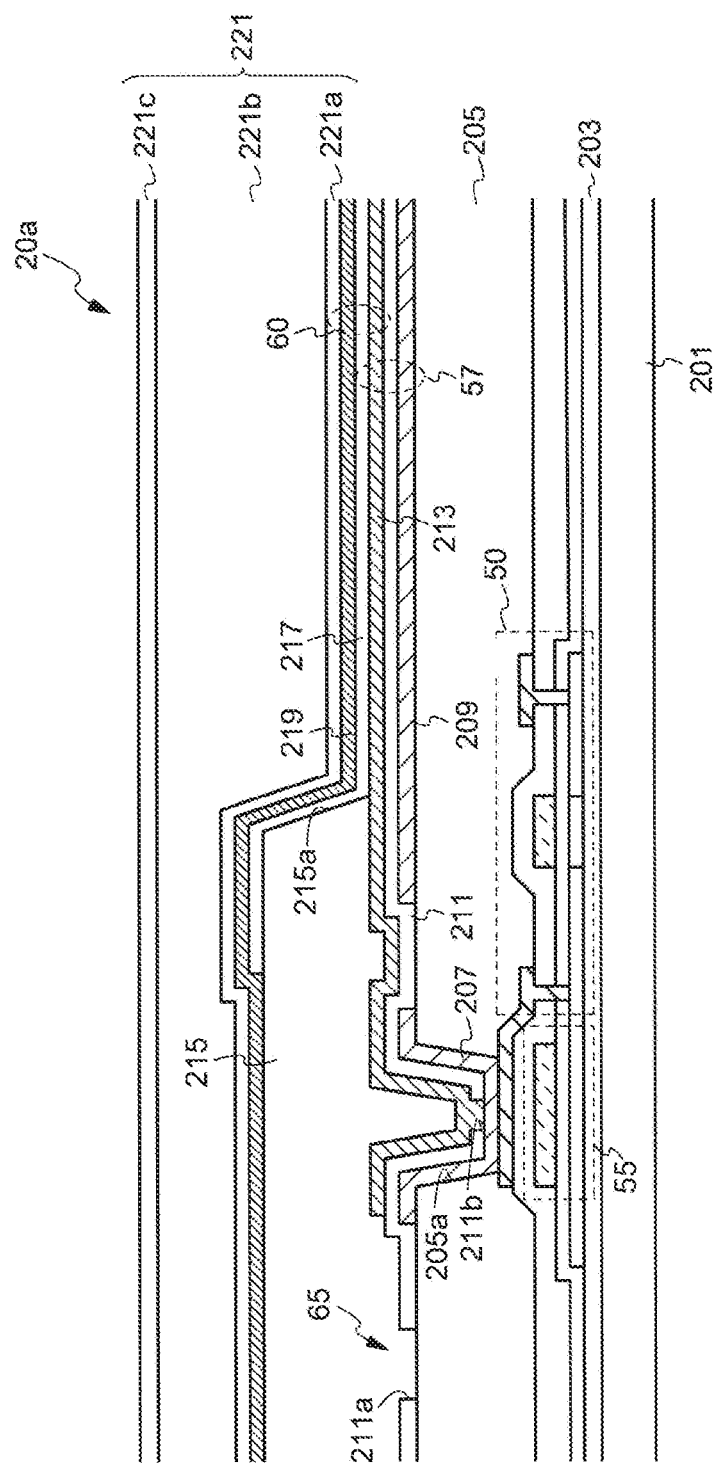
FIG. 2 is a cross-sectional diagram showing a structure of a pixel according to first embodiment of the present invention.

FIG. 2 is a cross-sectional view showing the structure of the pixel 20a in the first embodiment. In FIG. 2, a thin film transistor 50 is arranged above a support substrate 201 interposed by a base film 203. Although a glass substrate is used as the support substrate 201 in the present embodiment, a substrate made of a resin material such as acrylic or polyimide may also be used. An inorganic insulating film such as a silicon oxide film, a silicon nitride film or a silicon oxynitride film is used as the base film 203.

The thin film transistor 50 is a so-called top gate type thin film transistor. However, the present invention is not limited to this, and any type of thin film transistor may be arranged. The thin film transistor 50 shown in FIG. 2 functions as a drive transistor for supplying a current to the organic EL element 60. In addition, in the present embodiment, an N-channel transistor is used as the thin film transistor 50. Furthermore, since the structure of the thin film transistor 50 is a known structure, a detailed explanation is omitted here.

The storage capacitor 55 is connected to the thin film transistor 50. The storage capacitor 55 can be formed by utilizing two conductive films which form the thin film transistor 50 and an insulating film arranged therebetween. For example, the storage capacitor 55 of the present embodiment can be formed using a semiconductor layer which forms an active layer of the thin film transistor 50, a gate insulating film and a capacitor electrode (an electrode formed at the same time as the gate electrode). However, the structure of the storage capacitor 55 is not limited to this.

The thin film transistor 50 is covered by an organic insulating film 205. The organic insulating film 205 functions as a planarization film which planarizes unevenness caused by the shape of the thin film transistor 50. In the present embodiment, an insulating film including a resin material such as an acrylic resin or a polyimide resin is used as the organic insulating film 205.

An opening part 205a is arranged in the organic insulating film 205. The opening part 205a is covered by an oxide conductive film 207. In the present embodiment, the oxide conductive film 207 is formed by patterning a thin film formed from a metal oxide material such as ITO (Indium Tin Oxide) or IZO (Indium Zinc Oxide). However, the present invention is not limited to this, and another oxide conductive film may be used as the oxide conductive film 207. The oxide conductive film 207 is connected to a part (specifically, a source electrode) of the thin film transistor 50 which is exposed by the opening part 205a.

Furthermore, a lower electrode 209 of the storage capacitor 57 is formed on the upper surface of the organic insulating film 205 using an oxide conductive film which is formed simultaneously with the oxide conductive film 207. The lower electrode 209 is arranged below the organic EL element 60. As is described herein, since the organic EL element 60 of the present embodiment has a structure in which light is emitted upwards, it is possible to form the storage capacitor 57 using a space below the organic EL element 60.

Furthermore, although not shown in FIG. 2, the oxide conductive film 207 and the oxide conductive film used for forming the lower electrode 209 of the storage capacitor 57 can be used for separate purposes (for example, wiring). At this time, wiring resistance can also be lowered by overlapping a metal film on the oxide conductive film which is used as wiring. Since an oxide conductive film which forms a metal oxide has a higher resistance than a metal film, in the case when it is used as a wiring, it is preferred to overlap a metal film in order to lower the resistance as a whole. At this time, the oxide conductive film 207 described above also functions as a protective film which protects the source electrode of the thin film transistor 50 from an etching gas when forming the metal film.

An inorganic insulating film 211 is arranged the oxide conductive film 207 and above the lower electrode 209. In the present embodiment, although a silicon nitride film is used as the inorganic insulating film 211, the present invention is not limited to this, and other inorganic insulating films such as a silicon oxide film and a silicon oxynitride film can also be used. The inorganic insulating film 211 is arranged with an opening part 211a which exposes the organic insulating film 205. The opening part 211a functions as a drain region 65. The drain region 65 plays the role of releasing moisture which is generated from the organic insulating film 205 to the exterior by a heating process after forming the organic insulating film 205.

A pixel electrode 213 is arranged above the inorganic insulating film 211. The pixel electrode 213 is connected to the oxide conductive film 207 via the opening part 211b which is arranged in the inorganic insulating film 211. That is, the pixel electrode 213 is connected to the thin film transistor 50 via the oxide conductive film 207. In addition, the pixel electrode 213 functions as an upper electrode of the storage capacitor 57 and also functions as an anode electrode of the organic EL element 60.

Furthermore, as was described above, since a plurality of pixels 20a are arranged in a matrix in the pixel region 20, a plurality of pixel electrodes 213 are also arranged in a matrix in the pixel region 20. The structure of the pixel electrode 213 are described later.

Figure 3:
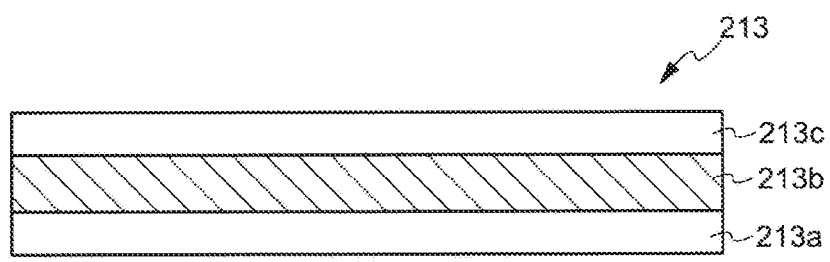
FIG. 3 is a cross-sectional diagram showing a structure of a pixel electrode according to first embodiment of the present invention.

In the present embodiment, a conductive film (a transparent conductive film) having a stacked layer structure in which a layer including silver is sandwiched between oxide conductive films is used as the pixel electrode 213. Specifically, as is shown in FIG. 3, the pixel electrode 213 is formed by an IZO layer 213a, a silver layer 213b, and an IZO layer 213c. However, it is possible to use an ITO layer instead of the IZO layers 213a and 213c. In order to obtain a structure in which light emitted from the organic EL element 60 is emitted upwards, it is desirable that the pixel electrode 213 includes a conductive film having reflectivity. As a result, in the present embodiment, a layer formed from a metal material containing silver or silver alloy having a high reflectance is used for a part of the pixel electrode 213.

In addition, in the present embodiment, since the dielectric of the storage capacitor 57 is a silicon nitride film having a higher dielectric constant than other insulating films, it has the advantage that a large capacity can be easily secured. Further, since the space below the organic EL element 60 can be effectively utilized, there is an advantage that it is possible to increase the area which can be used as the storage capacitor 57.

A part of the pixel electrode 213 is covered by a bank 215 formed from an organic material. Specifically, the bank 215 covers an end part of the pixel electrode 213 and also includes an opening part 215a which exposes a part of the upper surface of the pixel electrode 213. A part of the exposed upper surface of the pixel electrode 213 serves as a substantial light emitting region of the pixel 20a. That is, the bank 215 has a role for defining a light emitting region of the pixel 20a. A resin material such as an acrylic resin or a polyimide resin can be used as an organic material constituting the bank 215 but is not limited thereto.

An organic EL layer 217 is arranged in a region (that is, a region on the inner side of the opening 215a) which does not overlap the bank 215 on the upper surface of the pixel electrode 213. In the present embodiment, the organic EL layer 217 is formed by depositing an organic EL material by a vapor deposition method. The organic EL layer 217 includes at least a light emitting layer (not shown in the diagram), and can additionally include an electron injection layer, an electron transport layer, an electron blocking layer, a hole injection layer, a hole transport layer and/or a hole blocking layer. For example, it is possible to use an organic EL material which emits red, blue, or green light for the organic EL layer 217.

Furthermore, although a structure in which a light emitting layer having a different emission color for each pixel is exemplified in the present embodiment, the present invention is not limited to this structure. For example, although not shown in the diagram, it is possible to arrange an organic EL layer which emits white light over a plurality of pixels. In this case, white light is separated into each RGB color by a color filter arranged in each pixel. In addition, functional layers such as an electron injection layer, an electron transport layer, an electron blocking layer, a hole injection layer, a hole transport layer and a hole blocking layer may be arranged over a plurality of pixels.

A common electrode 219 formed from a conductive film containing an alkali metal or an alkaline earth metal is arranged above the organic EL layer 217. For example, magnesium (Mg), lithium (Li), or the like can be used as the alkali metal or alkaline earth metal. In the present embodiment, an MgAg film which is an alloy of magnesium and silver is used as the conductive film containing an alkaline earth metal. The common electrode 219 functions as a cathode electrode of the organic EL element 60. In addition, the common electrode 219 is arranged over a plurality of pixels.

In the case of a top emission type display device in which light emitted from the organic EL layer 217 is extracted to the upper surface side, that is, the common electrode 219 side, the common electrode 219 is required to have be translucent to light. In the case where the conductive film containing an alkali metal or alkaline earth metal described above is used as the common electrode 219, the thickness of the common electrode 219 is made sufficiently thin so that emitted light can to pass through in order to impart light translucency. Specifically, light translucency can be imparted by setting the film thickness of the common electrode 219 is 10 nm or more and 30 nm or less.

The organic EL element 60 is formed by the pixel electrode 213 described above, the organic EL layer 217 and common electrode 219.

A sealing film 221 is arranged above the common electrode 219 (that is, above the organic EL element 60). The sealing film 221 of the present embodiment includes has a three layer structure consisting of, in order from the bottom, a first sealing film 221a formed from an inorganic material, a second sealing film 221b formed from an organic material and a third sealing film 221c formed from an inorganic material. These sealing films play the role of preventing entry of moisture and the like from the outside and preventing deterioration of the organic EL layer 217 and the common electrode 219.

In the present embodiment, a silicon nitride film is used as the first sealing film 221a and the third sealing film 221c. However, the present invention is not limited to this and a silicon oxide film or a silicon oxynitride film may be used instead of the silicon nitride film. That is, it is possible to use an inorganic insulating film as the first sealing film 221a. It is particularly preferred to use an insulating film containing silicon nitride as the inorganic insulating film.

In addition, an organic insulating film formed from a resin material is used as the second sealing film 221b. In the present embodiment, by using an organic insulating film formed from a resin material as the second sealing film 221b, it is possible to planarize the unevenness formed by the banks 215. Since the first sealing film 221a has film thickness is around 1 μm, it is formed along an inclined surface of the bank 215. On the other hand, since the second sealing film 221b is formed with a film thickness of about 10 μm, a step such as the opening part 215a which is arranged in the bank 215 can be sufficiently filled. Therefore, by using an organic insulating film as the second sealing film 221b, it is possible to reduce the unevenness generated on the upper surface of the second sealing film 221b more than the unevenness generated on the upper surface of the first sealing film 221a.

<Configuration of the Pixel Electrode>

In the present embodiment, the outline of the pixel electrode 213 is processed into a rectangular wave shape. This point will be described below.

Figure 4:
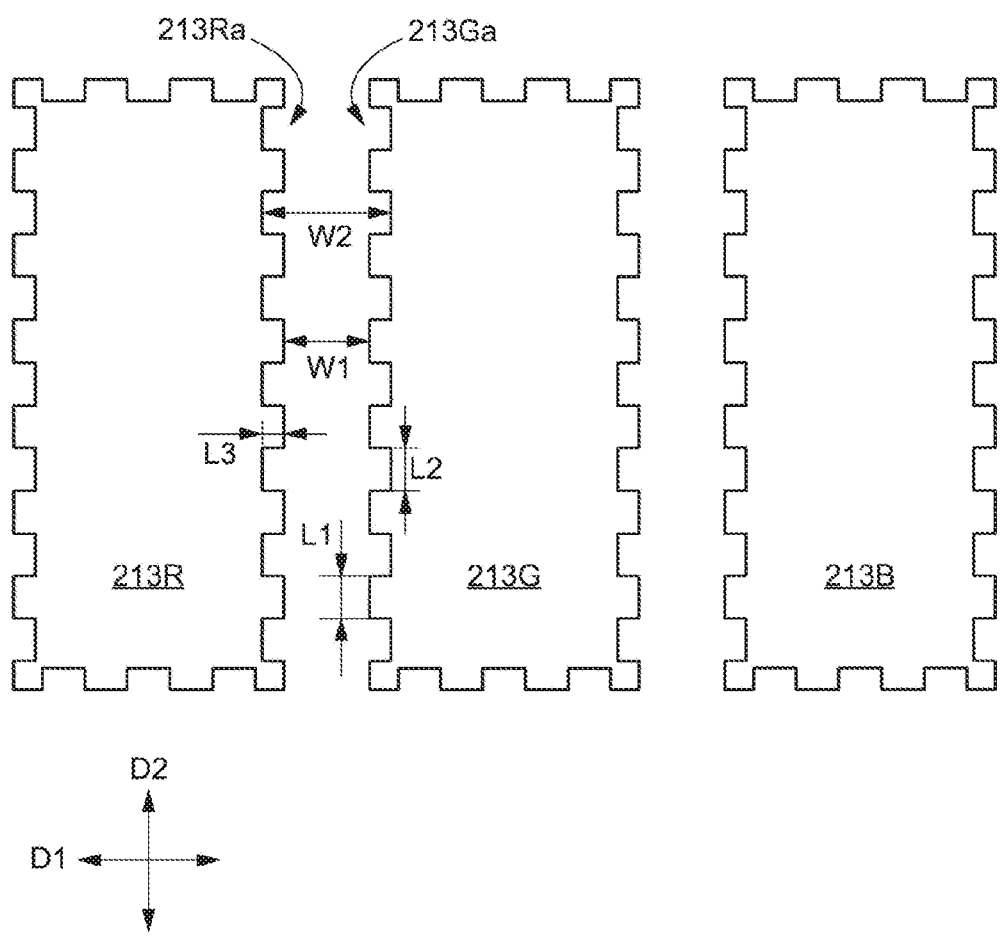
FIG. 4 is a planar diagram showing a structure of the pixel electrode according to first embodiment of the present invention.

FIG. 4 is a planar view showing the configuration of the pixel electrode 213 in the first embodiment. Specifically, FIG. 4 shows the configuration of the pixel electrodes 213R, 213G, and 213B included in each of the three sub-pixels constituting the pixel 20a of FIG. 1. The pixel electrodes 213R, 213G, and 213B are pixel electrodes of sub-pixel corresponding to red, green, and blue, respectively. In the present embodiment, the pixel 20a is configured by combining sub-pixel corresponding to three colors of red, green, and blue, but pixel configuration is not limited to this.

As shown in FIG. 4, the pixel electrode 213R and the pixel electrode 213G are adjacent to each other in the direction D1. In the following explanation, the relation between the pixel electrode 213R and the pixel electrode 213G will be described, but the relation between the pixel electrode 213G and the pixel electrode 213B, or the pixel electrode 213B and the pixel electrode 213R are also the same.

Here, the sides of the pixel electrode 213R and the pixel electrode 213G that face each other are referred to as a side 213Ra and a side 213Ga, respectively. In the present embodiment, each of the side 213Ra of the pixel electrode 213R and the side 213Ga of the pixel electrode 213G has a rectangular wave shape. The rectangular wave shape can be referred to as a shape in which concave part and convex part are repeated as shown in FIG. 4. Therefore, a gap having a width W1 and a gap having a width W2 are provided between the side 213Ra of the pixel electrode 213R and the side 213Ga of the pixel electrode 213G.

As shown in FIG. 4, the gap of the width W1 is a gap where the pixel electrode 213R and the pixel electrode 213G are closest to each other. Further, the gap of the width W2 is a gap between the pixel electrode 213R and the pixel electrode 213G which are farthest from each other. That is, in the present embodiment, the smallest distance between the side 213Ra of the pixel electrode 213R and the side 213Ga of the pixel electrode 213G is W1.

The side 213Ra of the pixel electrode 213R and the side 213Ga of the pixel electrode 213G are each formed of a plurality of sides. This point will be explained with reference to FIG. 5.

Figure 5:
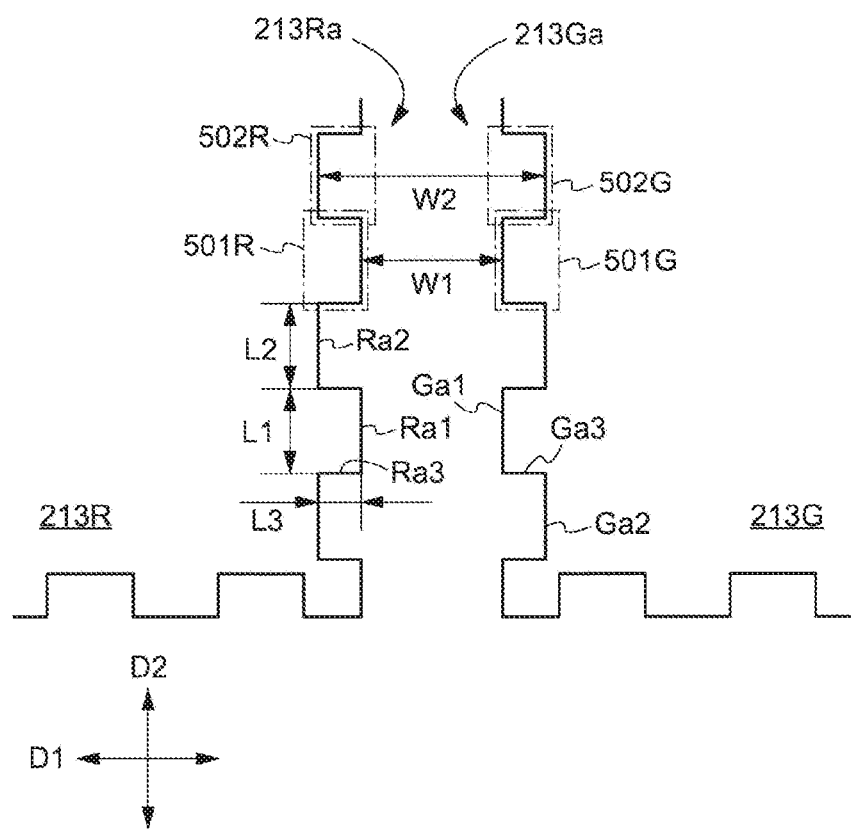
FIG. 5 is an enlarged planar diagram showing a structure of a part of the pixel electrode according to first embodiment of the present invention.

FIG. 5 is an enlarged planar view of a part of the configuration of the pixel electrode 213R and the pixel electrode 213G in the first embodiment. As shown in FIG. 5, the side 213Ra of the pixel electrodes 213R includes a plurality of sides Rat, Ra2 and Ra3. The side Ra1 is a side corresponding to the top of a convex part 501R. The side Ra2 corresponds to the bottom of a concave part 502R. The side Ra3 is a side common to the convex part 501R and the concave part 502R. That is, the side 213Ra is formed by repeating the side Ra1, Ra2 and Ra3.

Although the pixel electrode 213R is described here, the pixel electrode 213G has the same configuration. That is, the pixel electrode 213G also include a convex part 501G and a concave part 502G, and the side 213Ga is formed by repeating the sides Ga1, Ga2 and Ga3.

Here, in FIG. 5, the lengths of the sides Ra1, Ra2 and Ra3 are L1, L2, and L3, respectively. At this time, in the present embodiment, there is a relation of L3<L1=L2 between the length of the side Ra1, Ra2 and Ra3. That is, of a plurality of sides Ra1, Ra2 and Ra3 constituting the side 213Ra, Ra1 (or Ra2) has the largest length.

Figure 6:
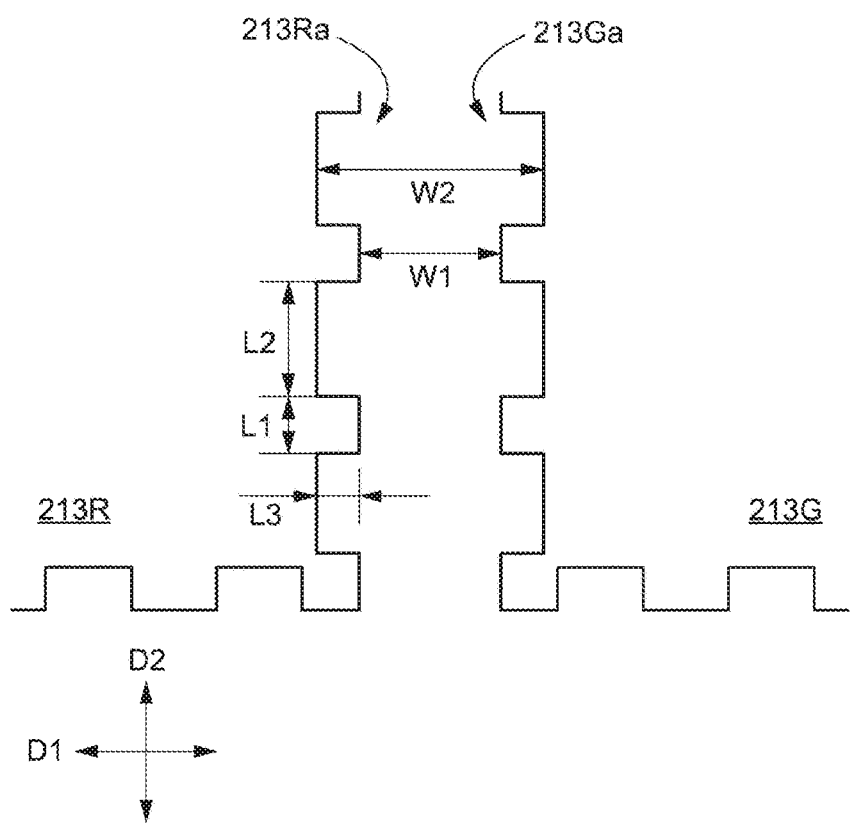
FIG. 6 is an enlarged planar diagram showing a structure of a part of the pixel electrode according to first embodiment of the present invention.

In the present embodiment, L1 and L2 have the same length, but L1 and L2 may have different lengths. For example, as shown in FIG. 6, it is also possible to make L2 longer than L1.

In the present embodiment, as shown in FIG. 5, the maximum length (i.e., the length of the side Rat) of a plurality of sides Ra1, Ra2 and Ra3 constituting the side 213Ra is shorter than the minimum distance (i.e., the width W1) between the side 213Ra and the side 213Ga. That is, even if the pixel electrode 213R has a part like the protrusion part 92a shown in FIG. 10 and any one of the sides Ra1, Ra2 and Ra3 is dropped, it is not positioned to straddle between the pixel electrode 213R and the pixel electrode 213G. Therefore, even if one of the sides Ra1, Ra2 and Ra3 generates particles, the pixel electrode 213R and the pixel electrode 213G are not short-circuited.

As described above, in the present embodiment, each side of the pixel electrode 213 is processed into a rectangular wave shape, and each side is divided into a plurality of sides. At this time, in the opposing sides between the neighboring pixel electrodes 213, the largest lengths of a plurality of sides constituting the respective sides are smaller than the smallest distances between the opposing sides. As a result, short-circuit due to particles between the neighboring pixel electrodes 213 can be prevented, and the yield and reliability of display device can be improved.

Second Embodiment

In the present embodiment, examples in which the configuration of the pixel electrode is different from that of the first embodiment will be described. In the present embodiment, portions that are the same as those of organic EL display device 100 of the first embodiment are denoted by the same reference numerals, and descriptions thereof may be omitted.

Figure 7:
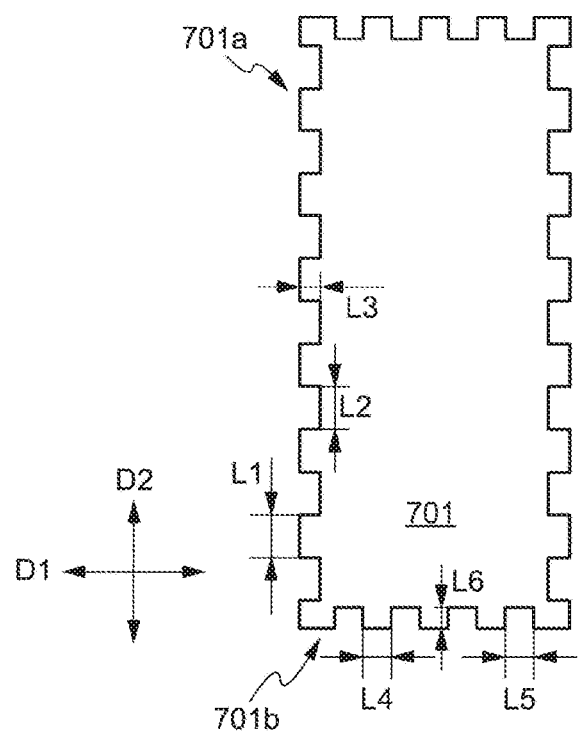
FIG. 7 is a planar diagram showing a structure of a pixel electrode according to second embodiment of the present invention.

FIG. 7 is a planar view showing the configuration of a pixel electrode 701 in the second embodiment. The pixel electrode 701 of the present embodiment have a side 701a along the direction D2 and a side 701b that intersect the side 701a and extend along the direction D1. In the present embodiment, a plurality of sides constituting the side 701a have lengths of L1, L2, and L3, respectively. On the other hand, each of a plurality of sides constituting the side 701b has a length of L4, L5, and L6.

At this time, each length has a relationship of L1>L4, L2>L5, and L3=L6. That is, the repetition cycle of the concave part and the convex part is shorter in the side 701b than in the side 701a. That is, the maximum length (L4) of a plurality of sides constituting the side 701b is shorter than the maximum length (L1) of a plurality of sides constituting the side 701a. Although L3 and L6 have the same length here, they may have different lengths.

If the distance between the pixel electrode 701 and the adjacent other pixel electrodes (not shown) in the D2 direction is shorter than the distance between the adjacent other pixel electrodes (not shown) in the D1 direction, as in the present embodiment, depending on the distance in the D2 direction L4 (or L5) may be shorter than L1 (or L2). That is, when the distance between the neighboring pixel electrodes in the direction D2 is short, it is desirable to shorten the lengths of a plurality of sides constituting the side 701b as much as possible so as not to generate long particles.

According to the present embodiment, when the distance between the pixel electrodes adjacent in the direction D1 and the distance between the pixel electrodes adjacent in the direction D2 are different, the repetition periods of the concave part and the convex part can be different according to the respective distances. As a result, it is possible to prevent short-circuit due to particles between adjoining the pixel electrodes according to the distance between the pixel electrode.

Third Embodiment

In the present embodiment, examples in which the configuration of the pixel electrode is different from that of the first embodiment will be described. In the present embodiment, a part that is the same as those of the organic EL display device 100 of the first embodiment is denoted by the same reference numerals, and descriptions thereof may be omitted.

Figure 8:
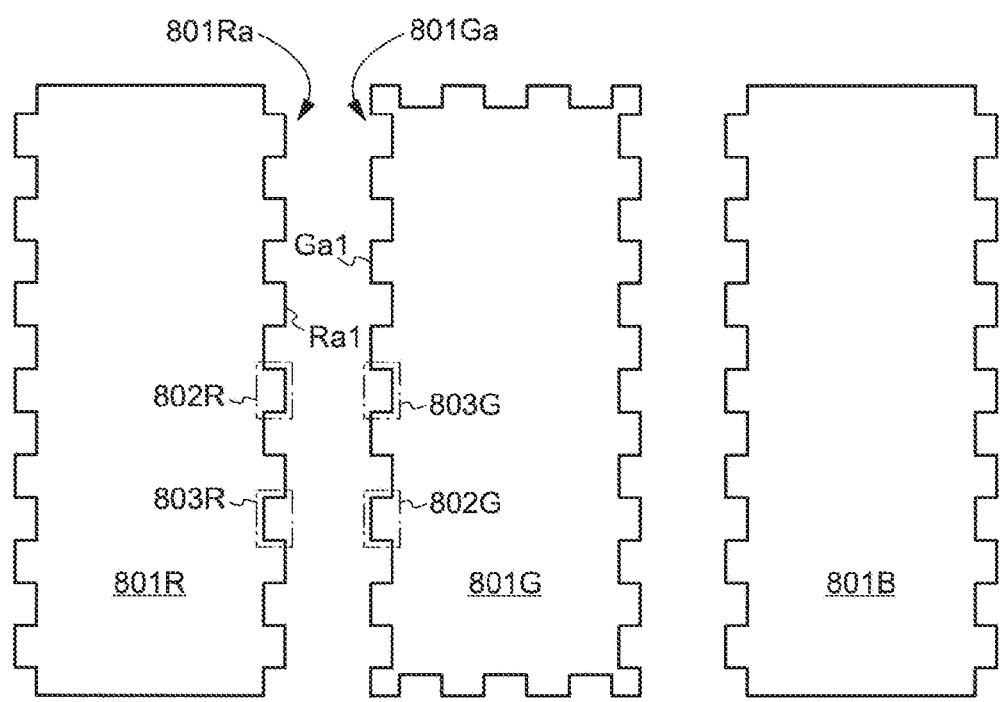
FIG. 8 is a planar diagram showing a structure of a pixel electrode according to third embodiment of the present invention.
Figure 8:
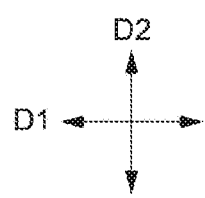

FIG. 8 is a planar view showing the configuration of pixel electrodes 801R, 801G, and 801B in the third embodiment. As shown in FIG. 8, the pixel electrode 801R and the pixel electrode 801G are adjacent to each other in the direction D1. In the following description, the relationship between the pixel electrode 801R and the pixel electrode 801G will be described, but the relationship between the pixel electrode 801G and the pixel electrode 801B, or the pixel electrode 801B and the pixel electrode 801R is the same.

Here, the sides of the pixel electrode 801R and the pixel electrode 801G that face each other are referred to as a side 801Ra and a side 801Ga, respectively. In the present embodiment, each of the side 801Ra of the pixel electrode 801R and the side 801Ga of the pixel electrode 801G has a rectangular wave shape. The pixel electrode 801R thus have a convex part 802R and a concave part 803R. The pixel electrode 801G include a convex part 802G and a concave part 803G.

This embodiment differs from the first embodiment in that, in the first embodiment, the convex part 501R and the convex part 501G (or the concave part 502R and the concave part 502G) face each other as shown in FIG. 5, whereas in the present embodiment, the convex part 802R and the concave part 803G (or the concave part 803R and the convex part 802G) face each other. In this manner, the convex part 802R and the convex part 802G of the neighboring pixel electrode 801R and the pixel electrode 801G may be shifted from each other.

Fourth Embodiment

In the present embodiment, examples in which the configuration of the pixel electrode is different from that of the first embodiment will be described. In the present embodiment, a part that is the same as those of the organic EL display device 100 of the first embodiment is denoted by the same reference numerals, and descriptions thereof may be omitted.

Figure 9:
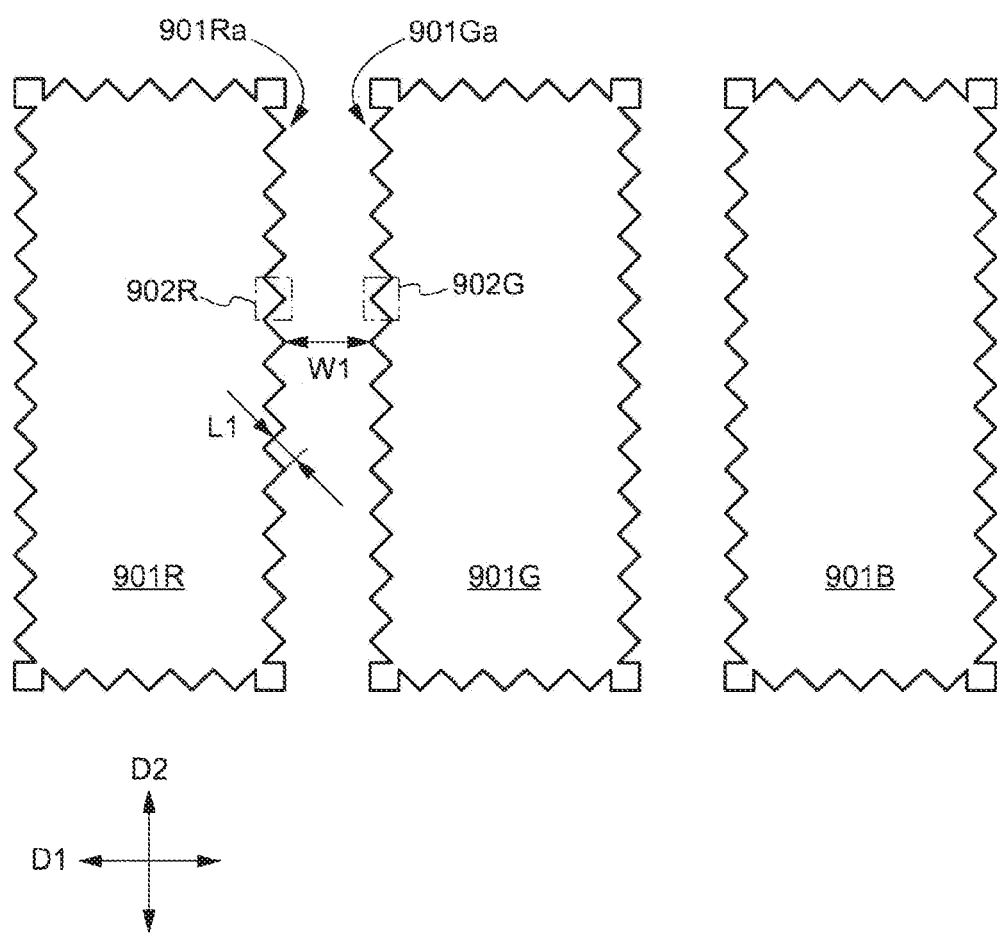
FIG. 9 is a planar diagram showing a structure of a pixel electrode according to fourth embodiment of the present invention.

FIG. 9 is a planar view showing a configuration of pixel electrodes 901R, 901G, and 901B in the fourth embodiment. As shown in FIG. 9, the pixel electrode 901R and the pixel electrode 901G are adjacent to each other in the direction D1. In the following description, the relationship between the pixel electrode 901R and the pixel electrode 901G will be described, but the relationship between the pixel electrode 901G and the pixel electrode 901B, or the pixel electrode 901B and the pixel electrode 901R is the same.

In the present embodiment, the sides of the pixel electrode 901R and the pixel electrode 901G facing each other are assumed to be a side 901Ra and a side 901Ga, respectively. In the present embodiment, each of the side 901Ra of the pixel electrode 901R and the side 901Ga of the pixel electrode 901G has a triangular wave shape. Here, the triangular wave shape may be a shape in which a substantially triangular convex part continues, or a jagged shape. The pixel electrode 901R and the pixel electrode 901G have a triangular convex part 902R and 902G, respectively.

In FIG. 9, the length of the sides of the triangular convex part 902R and 902G is L1. That is, the largest length of a plurality of sides constituting the side 901Ra of the pixel electrode 901R and the side 901Ga of the pixel electrode 901G is L1. The smallest distance between the side 901Ra of the pixel electrode 901R and the side 901Ga of the pixel electrode 901G is the width W1 between the apex of the convex part 902R and the apex of the convex part 902G.

In the present embodiment, as in the first embodiment, the maximum length (L1) of a plurality of sides constituting the side 901Ra of the pixel electrode 901R and the side 901Ga of the pixel electrode 901G is shorter than the minimum distance (W1) between the side 901Ra of the pixel electrode 901R and the side 901Ga of the pixel electrode 901G. Therefore, as in the first embodiment, short-circuit between the neighboring pixel electrodes due to particles can be prevented, and the yield and reliability of display device can be improved.

Fifth Embodiment

In the present embodiment, examples in which the configuration of the pixel electrode is different from that of the first embodiment will be described. In the present embodiment, a part that is the same as those of the organic EL display device 100 of the first embodiment is denoted by the same reference numerals, and descriptions thereof may be omitted.

Figure 10:
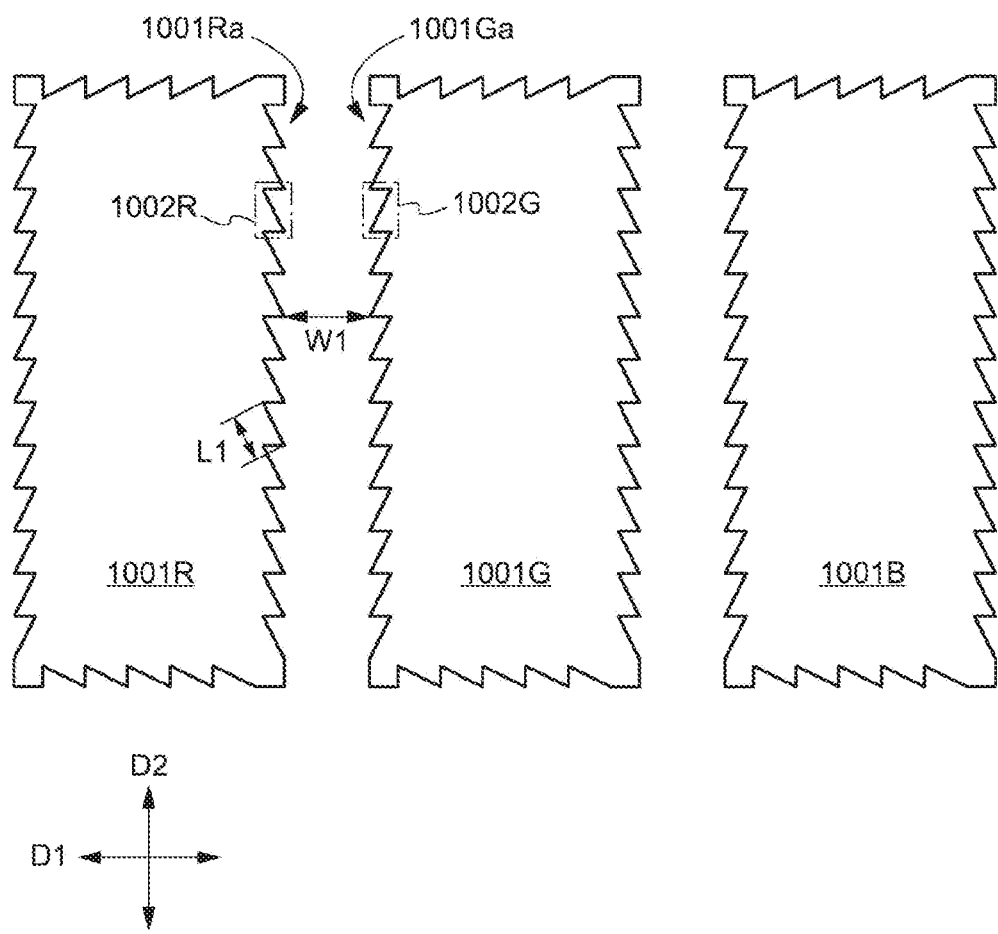
FIG. 10 is a planar diagram showing a structure of a pixel electrode according to fifth embodiment of the present invention.

FIG. 10 is a planar view showing the configuration of pixel electrodes 1001R, 1001G, and 1001B in the fifth embodiment. As shown in FIG. 10, the pixel electrode 1001R and the pixel electrode 1001G are adjacent to each other in the direction D1. In the following explanation, the relation between the pixel electrode 1001R and the pixel electrode 1001G will be described, but the relation between the pixel electrode 1001G and the pixel electrode 1001B, or the pixel electrode 1001B and the pixel electrode 1001R is also the same.

In the present embodiment, the sides of the pixel electrode 1001R and the pixel electrode 1001G facing each other are defined as a side 1001Ra and a side 1001Ga, respectively. In the present embodiment, each of the side 1001Ra of the pixel electrode 1001R and the side 1001Ga of the pixel electrode 1001G has a sawtooth wave shape. Here, the sawtooth-like shape may be a shape in which a convex part having a sawtooth-like shape continues. The pixel electrode 1001R and the pixel electrode 1001G each have a convex part 1002R and 1002G shaped like a sawtooth.

In FIG. 10, the length of the sides of the convex part 1002R and 1002G is L1. That is, the largest length of a plurality of sides constituting the side 1001Ra of the pixel electrode 1001R and the side 1001Ga of the pixel electrode 1001G is L1. The smallest distance between the side 1001Ra of the pixel electrode 1001R and the side 1001Ga of the pixel electrode 1001G is the width W1 between the apex of the convex part 1002R and the apex of the convex part 1002G.

In the present embodiment, as in the first embodiment, the maximum length (L1) of a plurality of sides constituting the side 1001Ra of the pixel electrode 1001R and the side 1001Ga of the pixel electrode 1001G is shorter than the minimum distance (W1) between the side 1001Ra of the pixel electrode 1001R and the side 1001Ga of the pixel electrode 1001G. Therefore, as in the first embodiment, short-circuit between the neighboring pixel electrodes due to particles can be prevented, and the yield and reliability of display device can be improved.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

In addition, although each of the embodiments described above was explained using the shape of a pixel electrode as an example of the embodiment of the present invention, it is possible to apply the present invention to an entire device (semiconductor device and display device) arranged with a stacked structure of films with different etching rates. That is, the present invention can be applied to a semiconductor device and a display device having a structure in which multiple conductive patterns are spaced apart from each other on an insulating surface.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A semiconductor device comprising:
   a first conductor pattern disposed on an insulating surface; and
   a second conductor pattern disposed on the insulating surface and spaced apart from the first conductor pattern, wherein
   the second conductor pattern is adjacent to the first conductor pattern in a first direction,
   in a planar view, a first side of the first conductor pattern and a second side of the second conductor pattern are each formed of a plurality of sides,
   the first side and the second side face each other,
   in the planar view, each of the first side and the second side has a convex part,
   the convex part is formed by the plurality of sides,
   the convex part of the first side and the convex part of the second side face each other in the first direction, and
   each of a maximum length of the plurality of sides constituting the first side and a maximum length of the plurality of sides constituting the second side is shorter than the minimum distance between the first side and the second side.

2. The semiconductor device according to claim 1, wherein each of the first side and the second side has a rectangular wave shape, a triangular wave shape or a sawtooth-like shape in the planar view.

3. The semiconductor device according to claim 1, wherein a gap having a first distance and a gap having a second distance longer than the first distance are provided between the first side and the second side,
   a minimum distance is the first distance, and
   the maximum length is a length of the sides facing each other at the first distance.

4. The semiconductor device according to claim 3, wherein a length of the sides facing each other at the first distance and a length of the sides facing each other at the second distance are different from each other.

5. The semiconductor device according to claim 3, wherein a third side intersecting with the first side of the first conductor pattern is formed by a plurality of sides in a planar view, and
   a maximum length of the plurality of sides constituting the third side is different from the maximum length of the plurality of sides constituting the first side.

6. The semiconductor device according to claim 3, wherein each of the first conductor pattern and the second conductor pattern is provided with a stacked structure of a metal film having a reflective function and a transparent conductive film.

7. The semiconductor device according to claim 6, wherein the metal film having a reflective function is formed from a material containing silver or silver alloy, and
   the transparent conductive film is formed from a material containing metal oxide.

8. A display device comprising:
   a first pixel electrode disposed on an insulating surface; and
   a second pixel electrode adjacent to the first pixel electrode and spaced apart from the first pixel electrode, wherein
   the second pixel electrode is adjacent to the first pixel electrode in a first direction,
   in a planar view, a first side of the first pixel electrode and a second side of the second pixel electrode are each formed of a plurality of sides,
   the first side and the second side face each other,
   in the planar view, each of the first side and the second side has a convex part,
   the convex part is formed by the plurality of sides,
   the convex part of the first side and the convex part of the second side face each other in the first direction, and
   each of a maximum length of the plurality of sides constituting the first side and a maximum length of the plurality of sides constituting the second side is shorter than the minimum distance between the first side and the second side.

9. The display device according to claim 8, wherein the first pixel electrode is an anode electrode of a first organic EL element, and
   the second pixel electrode is an anode electrode of a second organic EL element.

10. The display device according to claim 8, wherein the first organic EL element and the second organic EL element emit mutually different colors.

11. The display device according to claim 8, wherein each of the first side and the second side has a rectangular wave shape, a triangular wave shape or a sawtooth-like shape in the planar view.

12. The display device according to claim 8, wherein a gap having a first distance and a gap having a second distance longer than the first distance are provided between the first side and the second side,
   a minimum distance is the first distance, and
   the maximum length is a length of the sides facing each other at the first distance.

13. The display device according to claim 12, wherein a length of the sides facing each other at the first distance and a length of the sides facing each other at the second distance are different from each other.

14. The display device according to claim 8, wherein a third side intersecting with the first side of the first pixel electrode is formed by a plurality of sides in a planar view, and
   a maximum length of the plurality of sides constituting the third side is different from the maximum length of the plurality of sides constituting the first side.

15. The display device according to claim 8, wherein each of the first pixel electrode and the second pixel electrode is provided with a stacked structure of a metal film having a reflective function and a transparent conductive film.

16. The display device according to claim 15, wherein the metal film having a reflective function is formed from a material containing silver or silver alloy, and
   the transparent conductive film is formed from a material containing metal oxide.

\* \* \* \* \*